(12) United States Patent
Beak et al.

(10) Patent No.: US 11,158,700 B2
(45) Date of Patent: Oct. 26, 2021

(54) DISPLAY DEVICE HAVING MULTIPLE BUFFER LAYERS

(71) Applicant: LG Display Co., Ltd., Seoul (KR)

(72) Inventors: Jung-Sun Beak, Paju-si (KR); Jeong-Oh Kim, Goyang-si (KR); Jong-Won Lee, Seoul (KR); Dong-Kyu Lee, Gunsan-si (KR)

(73) Assignee: LG Display Co., Ltd, Seoul (KR)

( * ) Notice: Subject to any disclaimer, the term of this patent is extended or adjusted under 35 U.S.C. 154(b) by 0 days.

(21) Appl. No.: 15/852,016

(22) Filed: Dec. 22, 2017

(65) Prior Publication Data
US 2018/0182836 A1 Jun. 28, 2018

(30) Foreign Application Priority Data
Dec. 26, 2016 (KR) .................. 10-2016-0178948

(51) Int. Cl.
*H01L 27/32* (2006.01)
*H01L 49/02* (2006.01)
*H01L 27/12* (2006.01)

(52) U.S. Cl.
CPC ...... *H01L 27/3276* (2013.01); *H01L 27/3248* (2013.01); *H01L 27/3258* (2013.01); *H01L 27/3262* (2013.01); *H01L 27/3265* (2013.01); *H01L 28/60* (2013.01); *H01L 27/124* (2013.01); *H01L 27/1248* (2013.01); *H01L 27/1255* (2013.01); *H01L 27/1262* (2013.01); *H01L 27/3246* (2013.01); *H01L 2227/323* (2013.01)

(58) Field of Classification Search
CPC ............. H01L 27/3248; H01L 27/3276; H01L 27/3258; H01L 27/3262; H01L 27/3265
See application file for complete search history.

(56) References Cited

U.S. PATENT DOCUMENTS

| 2001/0005019 A1* | 6/2001 | Ishikawa ........... G02F 1/136213 |
| | | 257/59 |
| 2005/0202601 A1* | 9/2005 | Koide ................ H01L 27/1259 |
| | | 438/149 |
| 2005/0285107 A1* | 12/2005 | Koo .................... H01L 27/1214 |
| | | 257/59 |

(Continued)

FOREIGN PATENT DOCUMENTS

| CN | 102916036 A | 2/2013 |
| CN | 103839915 A | 6/2014 |

(Continued)

OTHER PUBLICATIONS

Office Action dated Apr. 12, 2021, issued in corresponding Chinese Patent Application No. 201711284742.1.

*Primary Examiner* — Matthew E. Gordon
(74) *Attorney, Agent, or Firm* — Morgan, Lewis & Bockius LLP

(57) ABSTRACT

Disclosed is a display device with high resolution. The display device includes a substrate, a plurality of signal lines on the substrate, multiple buffer layers including at least one organic buffer layer and at least one inorganic buffer layer, and at least one transistor that overlaps one or more of the plurality of signal lines, with the multiple buffer layers interposed therebetween. Accordingly, it may be possible to ensure a sufficient process margin and consequently to realize a high resolution and improve production yield.

21 Claims, 14 Drawing Sheets

(56) References Cited

U.S. PATENT DOCUMENTS

| | | | |
|---|---|---|---|
| 2008/0251790 A1* | 10/2008 | Cheng | G02F 1/136213 257/59 |
| 2011/0063267 A1* | 3/2011 | Sim | G09G 3/3225 345/205 |
| 2012/0175615 A1* | 7/2012 | You | H01L 27/3258 257/57 |
| 2014/0103313 A1 | 4/2014 | Ma et al. | |
| 2015/0060778 A1* | 3/2015 | Kim | H01L 27/3258 257/40 |
| 2015/0097172 A1* | 4/2015 | Han | H01L 27/3265 257/40 |
| 2015/0206929 A1* | 7/2015 | Sato | H01L 27/32 257/40 |
| 2017/0025439 A1 | 1/2017 | I et al. | |
| 2018/0122886 A1 | 5/2018 | Kim et al. | |

FOREIGN PATENT DOCUMENTS

| | | |
|---|---|---|
| CN | 105140246 A | 12/2015 |
| CN | 108022957 A | 5/2018 |

\* cited by examiner

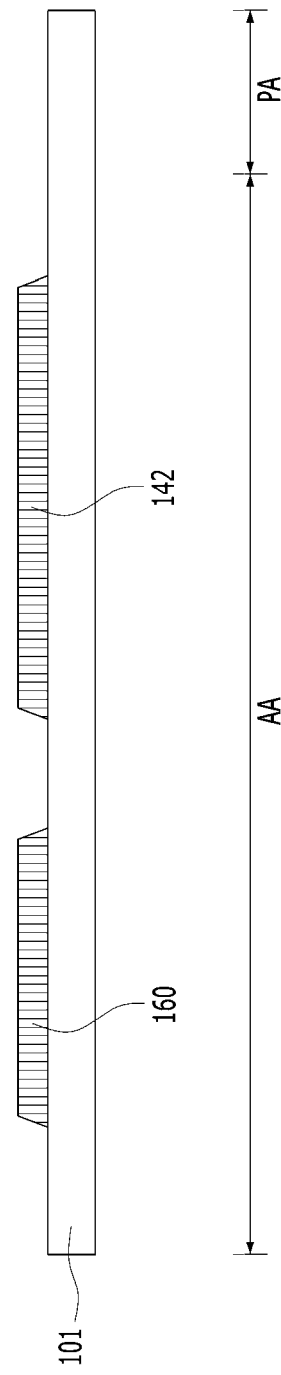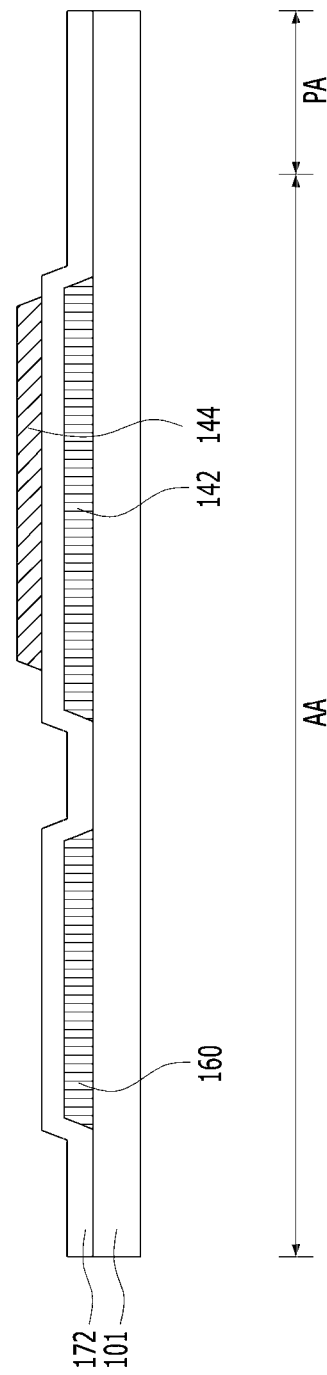

DISPLAY DEVICE HAVING MULTIPLE BUFFER LAYERS

This application claims the benefit of Korean Patent Application No. 10-2016-0178948, filed on Dec. 26, 2016, which is hereby incorporated by reference as if fully set forth herein.

BACKGROUND

Technical Field

The present disclosure relates to a display device, and more particularly, to a display device with high resolution.

Discussion of the Related Art

An image display device, which realizes various pieces of information on a screen, is a core technology of the information and communication age, and is being developed in the direction of becoming thinner, lighter, more portable, and having higher performance. As one example of a flat panel display device that is capable of overcoming the problems of the disadvantageous weight and volume of a cathode ray tube (CRT), an organic light-emitting display (OLED) device, which displays an image by controlling the intensity of luminescence of an organic emission layer, is attracting attention. The OLED device is a self-illuminating device and includes low power consumption, high response speed, high luminance efficacy, high brightness, and a wide viewing angle.

The OLED device displays an image using a plurality of subpixels, which are arranged in a matrix form. Here, each subpixel includes a light-emitting diode and a pixel-driving circuit having multiple transistors that implement independent driving of the light-emitting diode.

The light-emitting diode is formed on the multiple transistors included in the pixel-driving circuit through a mask process separate from the multiple transistors. Accordingly, as shown in FIG. 1, an emission area EA, in which the light-emitting diode is disposed, overlaps a transistor area TA, in which the multiple transistors are disposed, in the vertical direction. However, a storage capacitor included in the pixel-driving circuit is formed in the same plane and through the same mask process as the multiple transistors. Accordingly, a capacitor area CA, in which the storage capacitor is disposed, does not overlap the transistor area TA and is spaced apart from the transistor area TA in the vertical direction. Further, signal lines electrically connected to the multiple transistors, for example, a data line DL, a high-voltage VDD supply line VL1, and a low-voltage VSS supply line VL2, are arranged to be spaced apart from each other in the horizontal direction in consideration of the effect of parasitic capacitance. As such, because the signal lines DL, VL1 and VL2, the transistor area TA, and the capacitor area CA are arranged on the substrate to be spaced apart from each other in the horizontal direction, a process margin may be small, which may make it difficult to realize a high resolution and reduce production yield.

SUMMARY

Accordingly, the present disclosure is directed to a display device that substantially obviates one or more problems due to limitations and disadvantages of the related art.

An object of the present disclosure is to provide a display device with high resolution.

Another object of the present disclosure is to provide a display device with a sufficient process margin and consequently to realize a high resolution and improve production yield.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device includes a substrate, a plurality of signal lines on the substrate, multiple buffer layers including at least one organic buffer layer and at least one inorganic buffer layer, and at least one transistor that overlaps one or more of the plurality of signal lines, with the multiple buffer layers interposed therebetween.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIGS. 4A to 4K are sectional views for explaining an example method of manufacturing the organic light-emitting display device shown in FIG. 2.

DETAILED DESCRIPTION

Reference will now be made in detail to embodiments of the present disclosure, examples of which are illustrated in the accompanying drawings.

Wherever possible, the same reference numbers will be used throughout the drawings to refer to the same or like parts.

Figure 1:
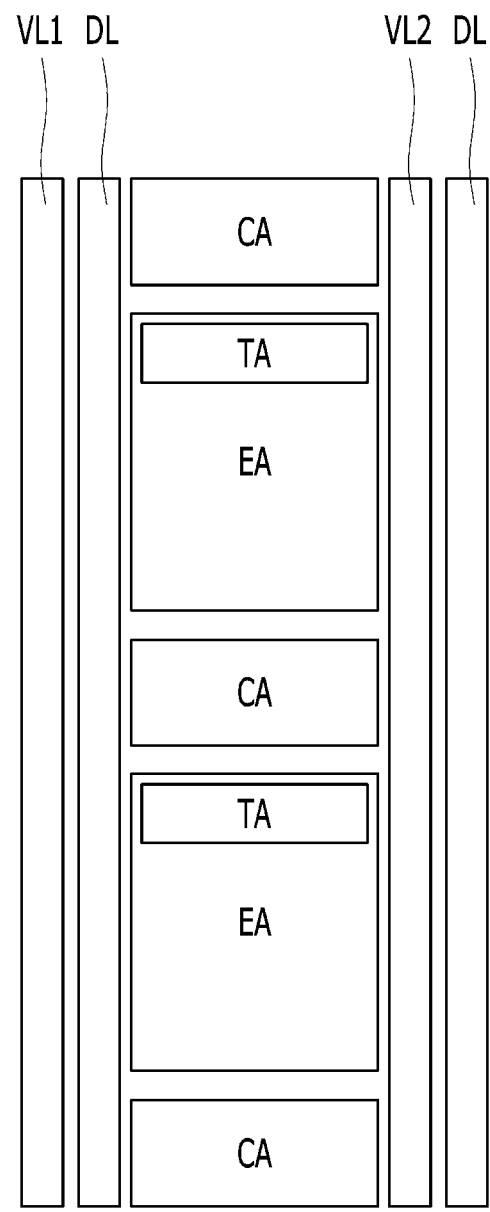
FIG. 1 is a plan view for explaining the arrangement of a transistor area, a capacitor area and an emission area of a organic light-emitting display device according to the related art.
Figure 2:
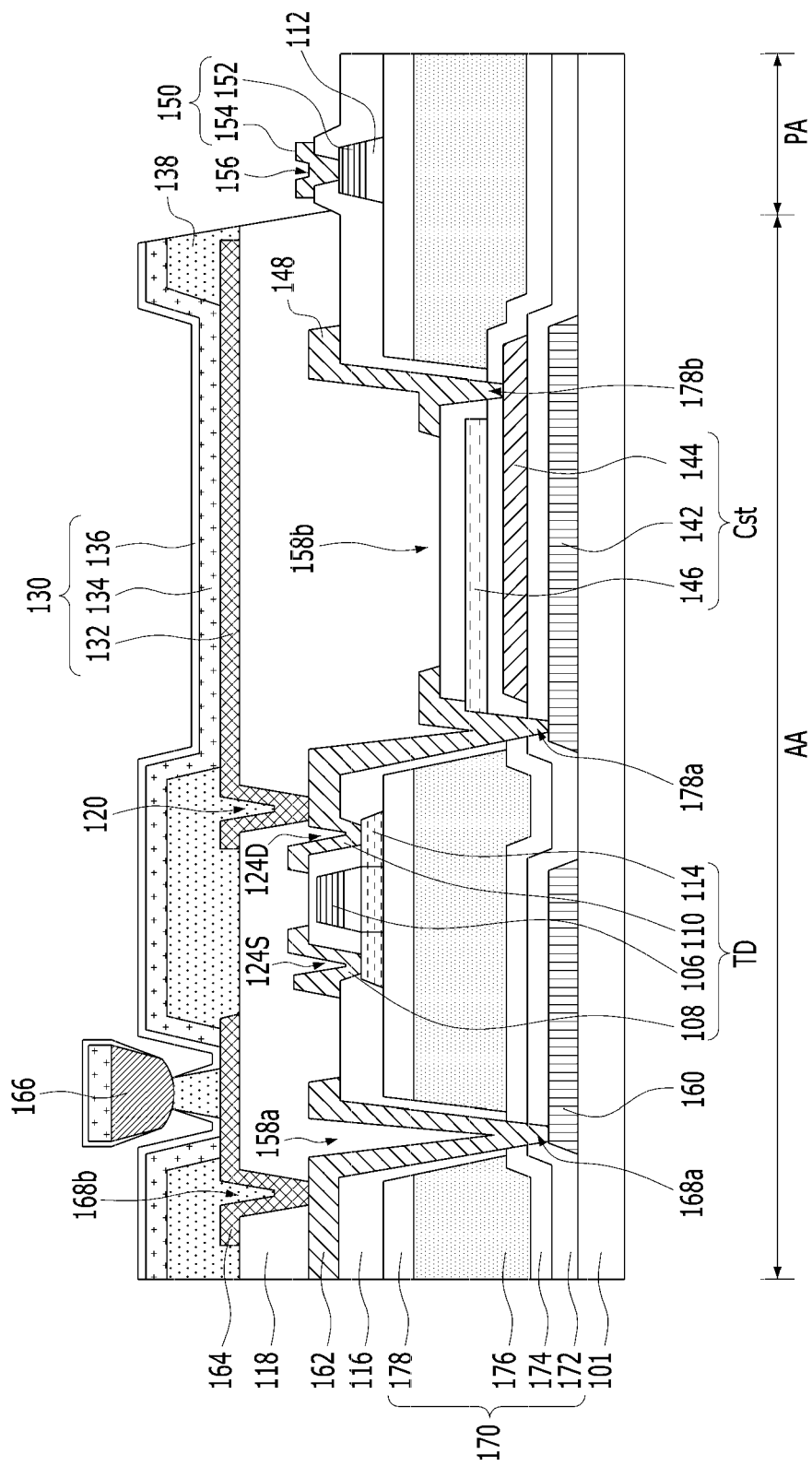
FIG. 2 is a sectional view illustrating an organic light-emitting display device according to an example embodiment of the present disclosure.

FIG. 2 is a sectional view of an organic light-emitting display device according to an example embodiment of the present disclosure.

The organic light-emitting display device shown in FIG. 2 includes an active area AA and a pad area PA.

A plurality of pads 150 is formed in the pad area PA in order to supply driving signals to a scan line, a data line, a high-voltage VDD supply line, and a low-voltage VSS supply line 160, which are disposed in the active area AA.

Each of the pads 150 includes a pad electrode 152 and a pad cover electrode 154.

The pad electrode 152 is formed on a gate insulation pattern 112, which has the same shape as the pad electrode 152, using the same material as gate electrode 106.

The pad cover electrode 154 is electrically connected to the pad electrode 152, which is exposed through a pad contact hole 156 that is formed to penetrate an interlayer insulation film 116. The pad cover electrode 154 is formed in the same layer as source and drain electrodes 108 and 110, that is, is formed on the interlayer insulation film 116 using the same material as the source and drain electrodes 108 and 110.

The active area AA is the area in which a plurality of subpixels is arranged in a matrix form and an image is displayed. Each of the subpixels arranged in the active area AA includes a pixel-driving circuit and a light-emitting diode 130, which is connected to the pixel-driving circuit.

The pixel-driving circuit includes a switching transistor, a driving transistor TD and a storage capacitor Cst.

When a scan pulse is supplied to the scan line, the switching transistor is turned ON and supplies a data signal, supplied to the data line, to the storage capacitor Cst and the gate electrode 106 of the driving transistor TD.

The driving transistor TD serves to adjust the magnitude of emission from the light-emitting diode 130 by controlling the current I supplied from the high-voltage supply line to the light-emitting diode 130 in response to a data signal supplied to the gate electrode 106 of the driving transistor TD. Owing to the voltage charged in the storage capacitor Cst, even if the switching transistor is turned OFF, the driving transistor TD makes the light-emitting diode 130 emit light by constantly supplying the current I until a data signal of the subsequent frame is supplied.

The driving transistor TD includes a gate electrode 106, a source electrode 108, a drain electrode 110, and an active layer 114.

The gate electrode 106 is formed on the gate insulation pattern 112, which has the same pattern as the gate electrode 106. The gate electrode 106 overlaps a channel region of the active layer 114, with the gate insulation pattern 112 interposed therebetween. The gate electrode 106 may have a single-layer structure or a multi-layer structure, which is formed of any one selected from among molybdenum (Mo), aluminum (Al), chrome (Cr), gold (Au), titanium (Ti), nickel (Ni), neodymium (Nd), and copper (Cu), or an alloy thereof. However, the example embodiment is not limited thereto.

Figure 3:
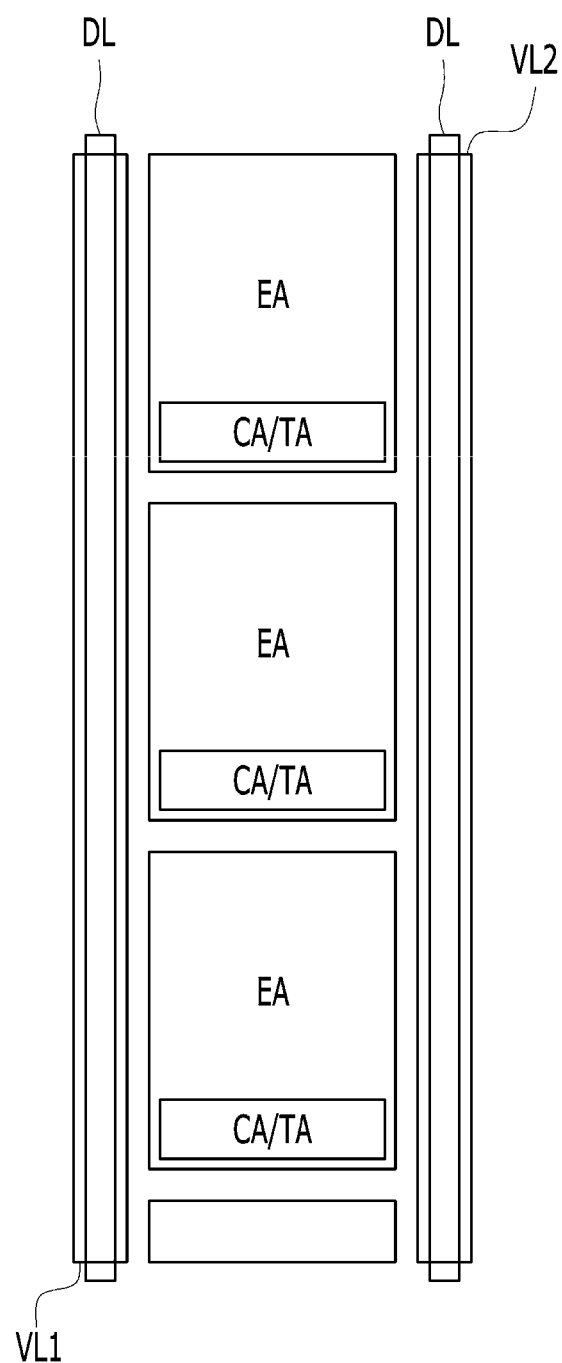
FIG. 3 is a plan view for explaining the arrangement of a transistor area, a capacitor area, and an emission area of the organic light-emitting display device according to an example embodiment of the present disclosure.

The source electrode 108 is connected to a source region of the active layer 114 through a source contact hole 124S, which is formed to penetrate the interlayer insulation film 116. The data line, which is connected to the source electrode 108 of the switching transistor, is formed of the same material as the source electrode simultaneously therewith. The data line DL, as shown in FIG. 3, is arranged parallel to the low-voltage supply line VL2 (160) and the high-voltage supply line VL1, which are disposed on the substrate 101. The data line DL overlaps at least one of the low-voltage supply line VL2 (160), the high-voltage supply line VL1 and the storage capacitor Cst in the vertical direction, with at least one buffer layer 170, including an organic buffer layer 176, interposed therebetween.

The drain electrode 110 is connected to the drain region of the active layer 114, which is exposed through a drain contact hole 124D that penetrates the interlayer insulation film 116. The drain electrode 110 is exposed through a pixel contact hole 120, which is formed to penetrate a planarization layer 118, and is connected to an anode 132.

The source electrode 108 and the drain electrode 110 may have a single-layer structure or a multi-layer structure, which is formed of any one selected from among, for example, molybdenum (Mo), aluminum (Al), chrome (Cr), gold (Au), titanium (Ti), nickel (Ni), neodymium (Nd), and copper (Cu), or an alloy thereof. However, the example embodiment is not limited thereto.

The active layer 114 includes a source region and a drain region, which is opposite the source region, with the channel region interposed therebetween. The channel region overlaps the gate electrode 106, with the gate insulation pattern 112 interposed therebetween. The source region is connected to the source electrode 108 through the source contact hole 124S, and the drain region is connected to the drain electrode 110 through the drain contact hole 124D. The source region and the drain region are formed of a semiconductor material into which an n-type or p-type dopant has been injected, and the channel region is formed of a semiconductor material into which neither an n-type nor a p-type dopant has been injected. Although the active layer 114 shown in FIG. 2 has been described as being formed of a polycrystalline semiconductor material, the active layer may alternatively be formed of at least one of an amorphous semiconductor material and an oxide semiconductor material.

Multiple buffer layers 170 are disposed between the active layer 114 and the substrate 101. The multiple buffer layers 170 are formed such that they include a first inorganic buffer layer 172, a second inorganic buffer layer 174, an organic buffer layer 176, and a third inorganic buffer layer 178 sequentially stacked on the substrate.

The first inorganic buffer layer 172 is disposed on the substrate 101, on which the low-voltage supply line 160 and a first storage electrode 142 have been formed. The first inorganic buffer layer 172 is formed of an inorganic insulation material such as, for example, SiOx, SiNx, or SiON, between the organic buffer layer 176 and each of the low-voltage supply line 160 and the first storage electrode 142. The first inorganic buffer layer 172 interrupts contact between the organic buffer layer 176 and each of the low-voltage supply line 160 and the first storage electrode 142. Accordingly, it may be possible to prevent the low-voltage supply line 160 and the first storage electrode 142 from being oxidized due to the diffusion of a solvent component contained in the organic buffer layer 176.

The second inorganic buffer layer 174 is disposed on the substrate 101, on which a second storage electrode 144 has been formed. The second inorganic buffer layer 174 is formed of an inorganic insulation material such as, for example, SiOx, SiNx, or SiON, between the second storage electrode 144 and the organic buffer layer 176. The second inorganic buffer layer 174 interrupts contact between the second storage electrode 144 and the organic buffer layer 176. Accordingly, it may be possible to prevent the second storage electrode 144 from being oxidized due to the diffusion of a solvent component contained in the organic buffer layer 176.

The organic buffer layer 176 is formed on the second inorganic buffer layer 174 using a material having a lower dielectric constant than the first and second inorganic buffer layers 172 and 174. The organic buffer layer 176 is formed of an organic material such as, for example, acrylic resin or epoxy resin. The organic buffer layer 176 is formed between at least one of the active layers 114 of the switching and driving transistors TD and at least one signal line selected from among the scan line, the data line DL, the high-voltage supply line and the low-voltage supply line 160. Further, the organic buffer layer 176 is formed between a first auxiliary connection electrode 162 and the low-voltage supply line 160. In this case, the magnitude of the parasitic capacitance formed between at least one signal line selected from among the scan line, the data line DL, the high-voltage supply line and the low-voltage supply line 160, which are disposed on the substrate 101, and each of the auxiliary connection electrode 162 and the constituent components of the switching and driving transistors TD, is in direct proportion to the dielectric constant of the organic buffer layer 176 and in inverse proportion to the thickness of the organic buffer layer 176. Accordingly, although the signal lines DL, VL1 and VL2, which are disposed on the substrate 101, overlap the constituent components of the switching and driving transistors TD and the auxiliary connection electrode 162, it may be possible to reduce signal interference therebetween.

Further, the organic buffer layer 176 is formed of a material having a hardening temperature equal to or higher than the temperature at which the third inorganic buffer layer 178 or the interlayer insulation film 116 is deposited on the organic buffer layer 176. The organic buffer layer 176 is formed of an organic material such as, for example, acrylic resin or epoxy resin. Accordingly, the organic buffer layer 176 has good heat resistance characteristics and is thus able to endure the deposition temperature of the third inorganic buffer layer 178 or the interlayer insulation film 116, which is disposed on the organic buffer layer 176.

In addition, the organic buffer layer 176 is formed to have first and second open holes 158a and 158b therein. The first open hole 158a is formed to have a larger width than a first auxiliary contact hole 168a and to penetrate the organic buffer layer 176 and the third inorganic buffer layer 178. Accordingly, it becomes easy to form the first auxiliary contact hole 168a, which is formed to penetrate the first and second inorganic buffer layers 172 and 174 and the interlayer insulation film 116 within the first open hole 158a. The second open hole 158b is formed to have a larger width than the third storage electrode 146 disposed in the second open hole 158b and to penetrate the organic buffer layer 176 and the third inorganic buffer layer 178. Accordingly, the second inorganic buffer layer 174, which covers the first and second storage electrodes 142 and 144, is exposed by the second open hole 158b, whereby it becomes easy to form the first and second storage contact holes 178a and 178b, which are formed to penetrate the first and second inorganic buffer layers 172 and 174 and the interlayer insulation film 116.

Like the first and second inorganic buffer layers 172 and 174, the third inorganic buffer layer 178 is formed of SiNx, SiOx, or SiON. The third inorganic buffer layer 178 is formed on the organic buffer layer 176 to have the same line width and the same shape as the organic buffer layer 176. Accordingly, it may be possible to prevent the emission of gas (fumes) and a solvent component from the organic buffer layer 176, which is formed of an organic film material. As a result, it may be possible to prevent the switching and driving transistors TD from being deteriorated by gas and a solvent component generated at the top surface of the organic buffer layer 176.

Meanwhile, the interlayer insulation film 116 is formed of SiNx, SiOx, or SiON on the side surfaces of the organic buffer layer 176 that are exposed by the first and second open holes 158a and 158b. The interlayer insulation film 116 blocks gas that is generated at the side surfaces of the organic buffer layer 176. Accordingly, it may be possible to prevent the switching and driving transistors TD from being deteriorated by gas that is generated at the side surfaces of the organic buffer layer 176. Further, the interlayer insulation film 116 prevents the first auxiliary connection electrode 162 and the drain electrodes 148 and 110 of the switching and driving transistors from coming into contact with the organic buffer layer 176. Accordingly, it may be possible to prevent the first auxiliary connection electrode 162 and the drain electrodes 148 and 110 of the switching and driving transistors from being oxidized by a solvent component contained in the organic buffer layer 176.

The storage capacitor Cst includes a first storage capacitor and a second storage capacitor, which are connected in parallel. The first storage capacitor is formed such that the first storage electrode 142 and the second storage electrode 144 overlap each other, with the first inorganic buffer layer 172 interposed therebetween. The second storage capacitor is formed such that the second storage electrode 144 and the third storage electrode 146 overlap each other, with the second inorganic buffer layer 174 interposed therebetween.

The first storage electrode 142 is formed as a first conductive layer, which is formed on the same layer (the substrate) as the low-voltage supply line 160 using the same material as the low-voltage supply line 160. The first storage electrode 142 is exposed through the first storage contact hole 178a, which penetrates the first and second inorganic buffer layers 172 and 174 and the interlayer insulation film 116, and is connected to the drain electrode 110 of the driving transistor TD. The first conductive layer is formed of an opaque metal such as, for example, Mo, Ti, Al, Cu, Cr, Co, W, Ta, or Ni. The low-voltage supply line 160 is formed to overlap the active layer 114 of the driving transistor TD. Accordingly, the low-voltage supply line 160 absorbs or reflects light incident thereon from the outside, thereby preventing external light from being incident on the channel region of the active layer 114 of the driving transistor TD.

The second storage electrode 144 is formed as a second conductive layer on the first inorganic buffer layer 172. Each of the first storage electrode 142, the second storage electrode 144, and the third storage electrode 146 has a first side portion on the same side and an opposite side portion on another side, which is opposite to the same side in the width direction. The first side portion of the second storage electrode 144 is formed to protrude in the width direction further than the first side portion of the third storage electrode 146. The first side portion of the second storage electrode 144, which protrudes further than the third storage electrode 146, is exposed through the second storage contact hole 178b, which penetrates the second inorganic buffer layer 174 and the interlayer insulation film 116, and is connected to the drain electrode 148 of the switching transistor. The second conductive layer is formed of an opaque metal such as, for example, Mo, Ti, Al, Cu, Cr, Co, W, Ta, or Ni.

The third storage electrode 146 is formed on the second inorganic buffer layer 174 using the same material as the active layer 114 of the driving transistor TD. The opposite side portion of the third storage electrode 146 is formed to protrude in the width direction further than the opposite side portion of the second storage electrode 144, and the opposite side portion of the first storage electrode 142 is formed to protrude in the width direction further than the opposite side portions of the second and third storage electrodes 144 and 146. Accordingly, the drain electrode 110 of the driving transistor TD is connected to the top surface of the first storage electrode 142 and the side surfaces of the third storage electrode 146, which are exposed through the first storage contact hole 178a, which penetrates the first and second inorganic buffer layers 172 and 174 and the interlayer insulation film 116.

As such, the storage capacitor Cst according to an example embodiment of the present disclosure includes the first storage capacitor and the second storage capacitor, which are connected in parallel using at least three storage electrodes 142, 144, and 146, which overlap each other, with at least one inorganic buffer layer interposed therebetween, thereby improving the capacity of the storage capacitor Cst. Further, in the display device according to an example embodiment of the present disclosure, because at least one transistor overlaps the signal line 160, with the multiple buffer layers 170, including at least one organic buffer layer 176 and at least one inorganic buffer layer 172, 174, and 178, interposed therebetween, it is possible to ensure a sufficient process margin and consequently to realize a high resolution and improve production yield. Further, though it is not shown in the sectional view of FIG. 2, in the display device according to an example embodiment of the present disclosure, at least one transistor may overlap the storage capacitor Cst, with the multiple buffer layers including at least one organic buffer layer 176 interposed therebetween, it may be possible to ensure a sufficient process margin and consequently to realize a high resolution and improve production yield.

The light-emitting diode 130 includes an anode 132, which is connected to the drain electrode 110 of the driving transistor TD, at least one light-emitting stack 134, which is formed on the anode 132, and a cathode 136, which is formed on the light-emitting stack 134.

The anode 132 is disposed on a planarization layer 118 and is exposed through a bank 138. The anode 132 is electrically connected to the drain electrode 110 of the driving transistor TD, which is exposed through the pixel contact hole 120. Like the second auxiliary connection electrode 164, the anode 132 is formed in a multi-layer structure including a transparent conductive film and an opaque conductive film having high reflection efficiency. The transparent conductive film is formed of a material having a relatively high work function, e.g., indium-tin-oxide (ITO) or indium-zinc-oxide (IZO), and the opaque conductive film is formed in a single-layer or multi-layer structure including any one selected from among Al, Ag, Cu, Pb, Mo, and Ti or an alloy thereof. For example, the anode 132 may be formed in a structure such that a transparent conductive film, an opaque conductive film and a transparent conductive film are sequentially stacked, or such that a transparent conductive film and an opaque conductive film are sequentially stacked.

The light-emitting stack 134 is formed by stacking, on the anode 132, a hole-related layer, an organic emission layer, and an electron-related layer, either in that order or in the reverse order. In addition, the light-emitting stack 134 may include first and second light-emitting stacks, which are opposite each other with a charge generation layer interposed therebetween. In this case, an organic emission layer of any one of the first and second light-emitting stacks generates blue light, and an organic emission layer of the remaining one of the first and second light-emitting stacks generates yellow-green light, with the result that white light is generated via the first and second light-emitting stacks. Because the white light is introduced into a color filter (not shown) disposed on the light-emitting stack 134, the organic light-emitting display device is capable of realizing a color image. Alternatively, it may be possible to realize a color image in a manner such that each light-emitting stack 134 generates colored light corresponding to each subpixel without a separate color filter. That is, a light-emitting stack 134 of a red (R) subpixel may generate red light, a light-emitting stack 134 of a green (G) subpixel may generate green light, and a light-emitting stack 134 of a blue (B) subpixel may generate blue light.

The bank 138 may be formed to expose the anode 132 and the second auxiliary connection electrode 164. The bank 138 may be formed of an opaque material (e.g., a black material) in order to prevent optical interference between neighboring subpixels. In this case, the bank 138 includes a light-shielding material including at least one of a color pigment, organic black, and carbon materials.

A partition 166 separates the light-emitting stacks 134, which are disposed in neighboring subpixels that realize mutually different colors, from each other. To this end, the partition 166 is formed on the bank 138, which is disposed on the second auxiliary connection electrode 164, and has an inversely tapered shape. The width of the inversely-tapered-shaped partition 166 gradually increases from the bottom surface thereof to the top surface thereof.

The light-emitting stack 134, which is grown straight, is not formed on the second auxiliary connection electrode 164, which overlaps the inversely-tapered-shaped partition 166. Therefore, the light-emitting stacks 134, which are disposed in neighboring subpixels that realize mutually different colors from each other, are separated from each other on the second auxiliary connection electrode 164 by the partition 166. In this case, the light-emitting stack 134 is formed only on the top surface of the anode 132 exposed by the bank 138, the top surface of the partition 166, and the top surface and the side surfaces of the bank 138. On the other hand, because the cathode 136, which has step coverage superior to that of the light-emitting stack 134, is also formed on the top surface and the side surfaces of the partition 166 and the side surfaces of the bank 138 disposed under the partition 166, the cathode 136 may be easily brought into contact with the second auxiliary connection electrode 164.

The cathode 136 is formed on the top surfaces and the side surfaces of the light-emitting stack 134 and the bank 138 to be opposite to the anode 132 with the light-emitting stack 134 interposed therebetween. In the case in which the cathode 136 is applied to a top-emission-type organic light-emitting display device, the cathode 136 is a transparent conductive film formed of, for example, indium-tin-oxide (ITO) or indium-zinc-oxide (IZO).

The cathode 136 is connected to the low-voltage supply line 160 via the first and second auxiliary connection electrodes 162 and 164.

The low-voltage supply line 160 overlaps the driving transistor TD, with the first inorganic buffer layer 172, the organic buffer layer 176 and the second inorganic buffer layer 174 interposed therebetween. The low-voltage supply line 160 is formed on the substrate 101 using the same material as the first storage electrode 142.

The first auxiliary connection electrode 162 is electrically connected to the low-voltage supply line 160, which is exposed through the first auxiliary contact hole 168a penetrating the first and second inorganic buffer layers 172 and 174 and the interlayer insulation film 116. The first auxiliary connection electrode 162 is formed in the same plane as the source and drain electrodes 108 and 110, that is, is formed on the interlayer insulation film 116 using the same material as the source and drain electrodes 108 and 110.

The second auxiliary connection electrode 164 is electrically connected to the first auxiliary connection electrode 162, which is exposed through the second auxiliary contact hole 168b penetrating the planarization layer 118. The second auxiliary connection electrode 164 is formed in the same plane as the anode 132, that is, is formed on the planarization layer 118 using the same material as the anode 132.

Because the low-voltage supply line 160 and the first and second auxiliary connection electrodes 162 and 164 are formed of a metal having conductivity superior to that of the cathode 136, the low-voltage supply line 160 and the first and second auxiliary connection electrodes 162 and 164 may compensate for the high resistance of the cathode 136, which is a transparent conductive film formed of ITO or IZO.

As such, the driving transistor TD according to an example embodiment of the present disclosure overlaps the low-voltage supply line 160, with the buffer layer 170 interposed therebetween. Accordingly, the low-voltage supply line 160 overlaps the emission area EA and the transistor area TA, in which the driving transistor TD is disposed, thereby ensuring a sufficient process margin and consequently realizing a high resolution and improving production yield. Further, the data line DL, as shown in FIG. 3, overlaps at least one of the high-voltage supply line VL1 and the low-voltage supply line VL2 (160) in the vertical direction, with at least one buffer layer 170, including the organic buffer layer 176, interposed therebetween. As a result, may be is possible to ensure a sufficient process margin and consequently to realize a high resolution and improve production yield.

FIGS. 4A to 4K are sectional views for explaining an example method of manufacturing the organic light-emitting display device shown in FIG. 2.

With reference to FIG. 4A, the first storage electrode 142 and the low-voltage supply line 160 are formed on the substrate 101.

For example, the first conductive layer is deposited on the entire surface of the substrate 101 and is then patterned through a photolithography process and an etching process, whereby the first storage electrode 142 and the low-voltage supply line 160 are formed.

With reference to FIG. 4B, the first inorganic buffer layer 172 is formed on the substrate 101, on which the first storage electrode 142 and the low-voltage supply line 160 have been formed, and the second storage electrode 144 is formed on the first inorganic buffer layer 172.

For example, the first inorganic buffer layer 172 is formed such that an inorganic insulation material such as SiOx or SiNx is deposited on the entire surface of the substrate 101, on which the first storage electrode 142 and the low-voltage supply line 160 have been formed. Subsequently, the second conductive layer is deposited on the entire surface of the substrate, on which the first inorganic buffer layer 172 has been formed, and is then patterned through a photolithography process and an etching process, whereby the second storage electrode 144 is formed.

Figure 4C:
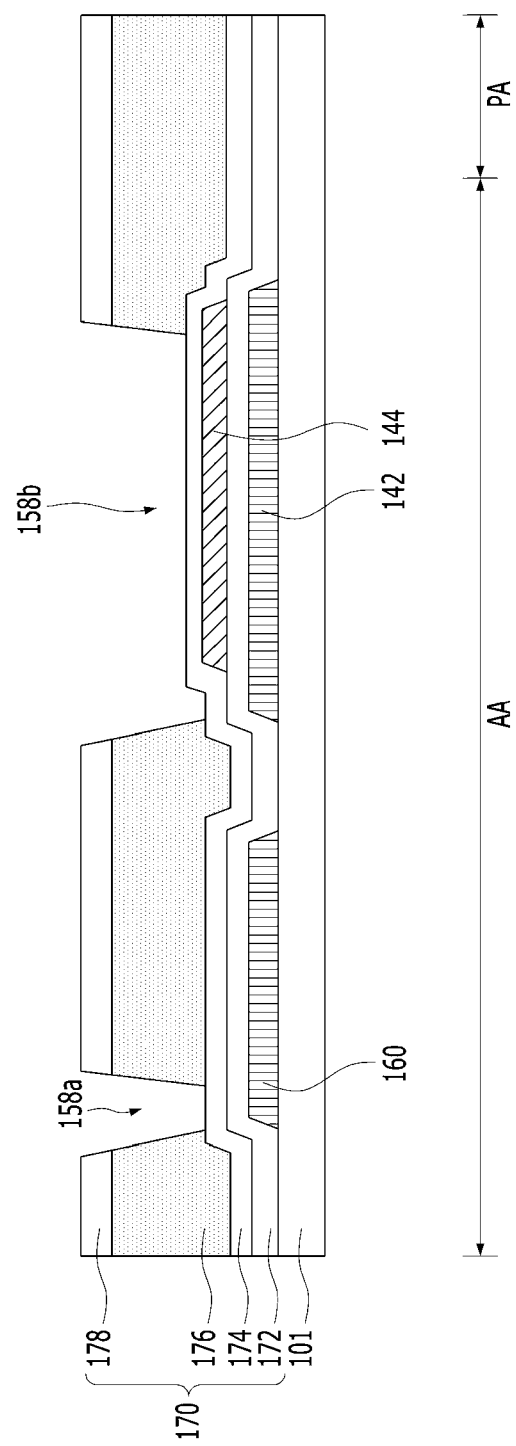

With reference to FIG. 4C, the second inorganic buffer layer 174, as well as the organic buffer layer 176 and the third inorganic buffer layer 178, which have therein the first and second open holes 158a and 158b, are formed on the substrate 101, on which the second storage electrode 144 has been formed.

For example, the second inorganic buffer layer 174 is formed such that an inorganic insulation material such as SiOx or SiNx is deposited on the entire surface of the substrate 101, on which the second storage electrode 144 has been formed. Subsequently, the organic buffer layer 176 is formed such that an organic insulation material such as acrylic resin is coated on the entire surface of the second inorganic buffer layer 174. The third inorganic buffer layer 178 is formed such that an inorganic insulation material such as SiOx or SiNx is deposited on the entire surface of the organic buffer layer 176. Subsequently, the organic buffer layer 176 and the third inorganic buffer layer 178 are patterned through a photolithography process and an etching process to form the first and second open holes 158a and 158b. The first open hole 158a is formed to penetrate the organic buffer layer 176 and the third inorganic buffer layer 178 that are disposed on the low-voltage supply line 160, thereby exposing the second inorganic buffer layer 174 positioned on the low-voltage supply line 160. The second open hole 158b is formed to penetrate the organic buffer layer 176 and the third inorganic buffer layer 178 that are disposed on the second storage electrode 144, thereby exposing the second inorganic buffer layer 174 positioned on the second storage electrode 144.

Figure 4D:
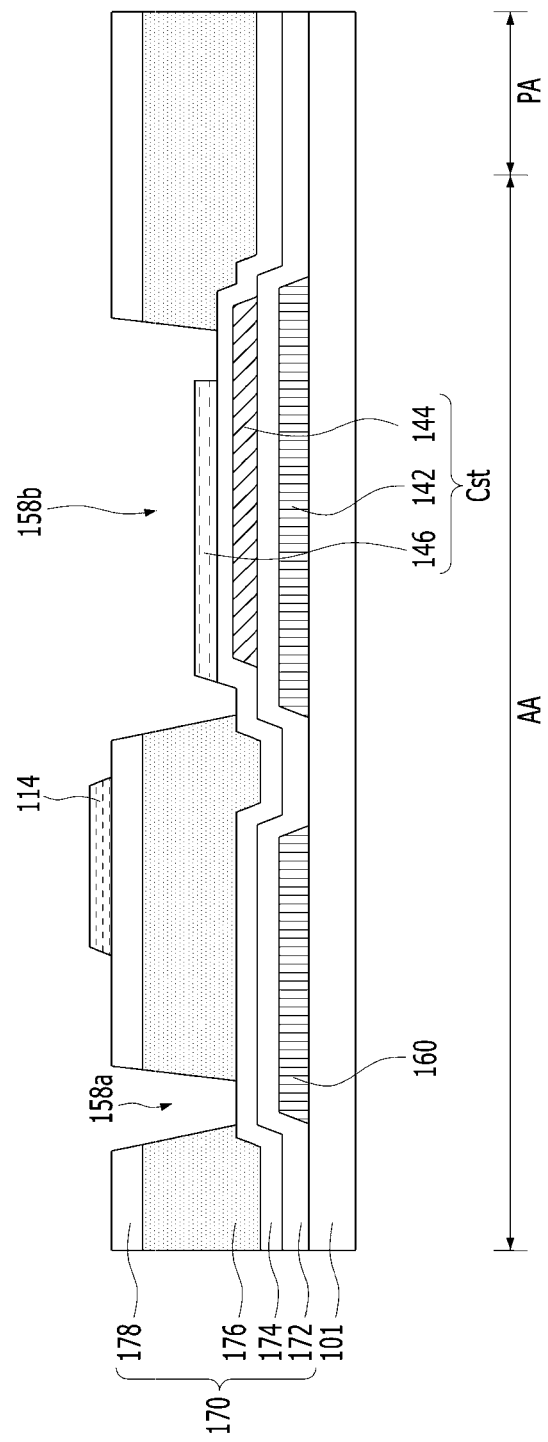

With reference to FIG. 4D, the active layer 114 and the third storage electrode 146 are formed on the substrate 101, on which the organic buffer layer 176 and the third inorganic buffer layer 178, which have therein the first and second open holes 158a and 158b, have been formed.

For example, an amorphous silicon thin film is formed on the substrate 101, on which the organic buffer layer 176 and the third inorganic buffer layer 178 have been formed, through a low-pressure chemical vapor deposition (LPCVD) or plasma-enhanced chemical vapor deposition (PECVD) method. Subsequently, a polycrystalline silicon thin film is formed by crystallizing the amorphous silicon thin film. Subsequently, the polycrystalline silicon thin film is patterned through a photolithography process and an etching process, whereby the active layer 114 and the third storage electrode 146 are formed.

Figure 4E:
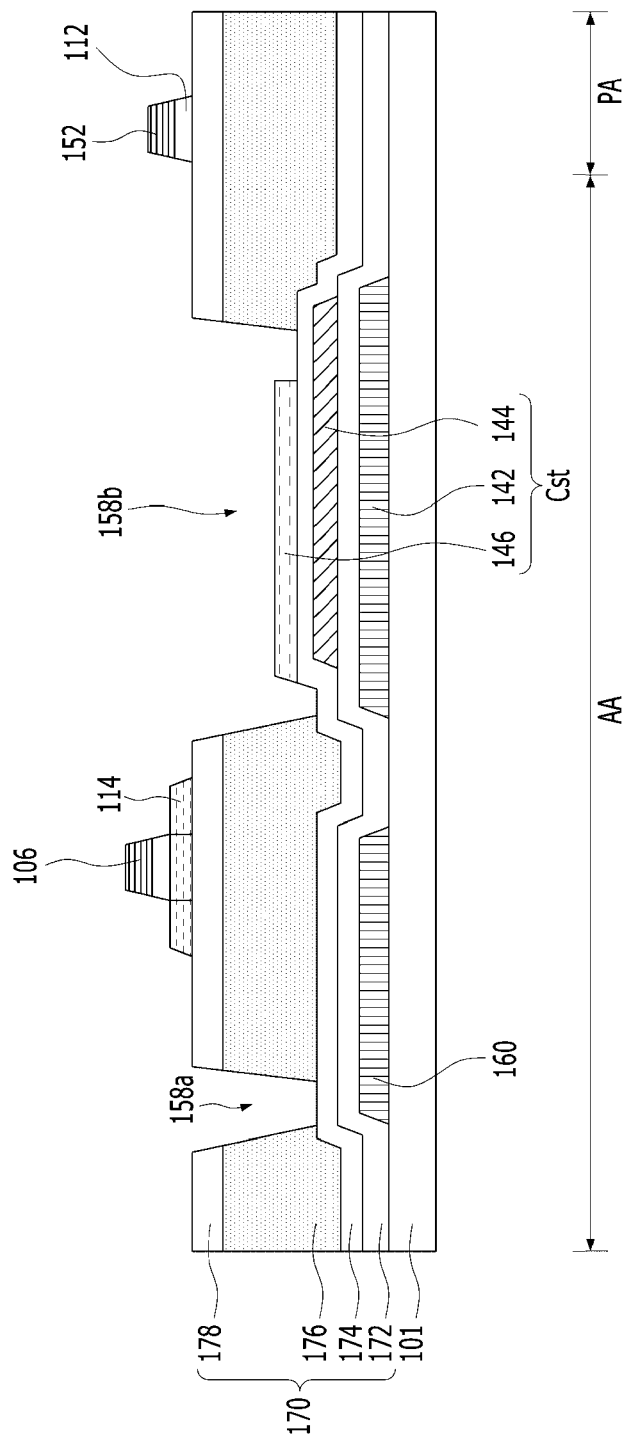

With reference to FIG. 4E, the gate insulation pattern 112 is formed on the substrate 101, on which the active layer 114 and the third storage electrode 146 have been formed, and the gate electrode 106 and the pad electrode 152 are formed on the gate insulation pattern 112.

For example, the gate insulation film is formed on the substrate 101, on which the active layer 114 and the third storage electrode 146 have been formed, and a third conductive layer is formed on the gate insulation film through, for example, a sputtering deposition method. The gate insulation film is formed of an inorganic insulation material such as SiOx or SiNx. The third conductive layer may have a single-layer structure or a multi-layer structure, which is formed of a metal material such as, for example, Mo, Ti, Cu, AlNd, Al, Cr, or an alloy thereof. Subsequently, the third conductive layer and the gate insulation film are patterned at the same time through a photolithography process and an etching process, whereby the gate electrode 106 and the gate insulation pattern 112 positioned thereunder are formed to have the same pattern as each other and the pad electrode 152 and the gate insulation pattern 112 positioned thereunder are formed to have the same pattern as each other. Subsequently, the source region and the drain region of the active layer 114 are formed by injecting an n$^+$-type or p$^+$-type dopant into the active layer 114 using the gate electrode 106 as a mask, and an n$^+$-type or p$^+$-type dopant is injected into the third storage electrode 146 at the same time so that the third storage electrode 146 becomes conductive.

Figure 4F:
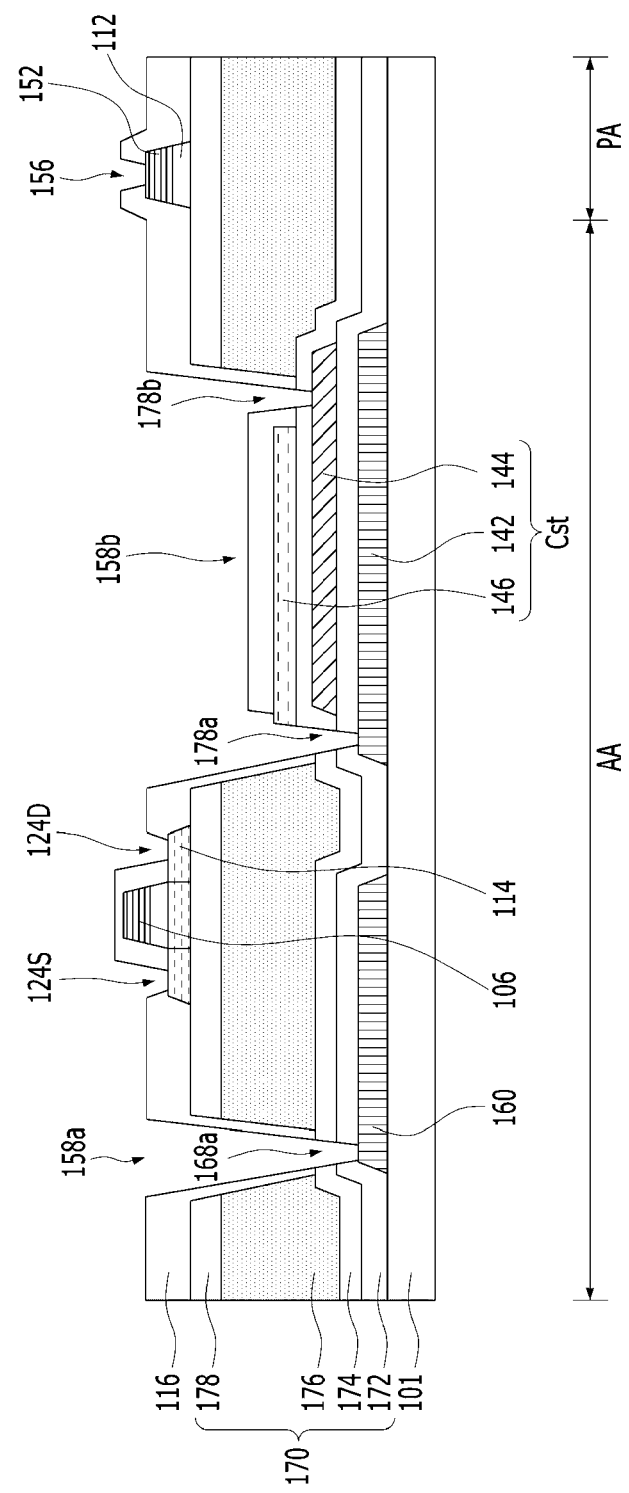

With reference to FIG. 4F, the interlayer insulation film 116, which has therein the source and drain contact holes 124S and 124D, the pad contact hole 156, the first and second storage contact holes 178a and 178b, and the first auxiliary contact hole 168a, is formed on the substrate 101, on which the gate electrode 106 and the pad electrode 152 have been formed.

For example, the interlayer insulation film 116 is formed on the substrate 101, on which the gate electrode 106 and the pad electrode 152 have been formed, through, for example, a plasma-enhanced chemical vapor deposition (PECVD) method. Subsequently, the interlayer insulation film 116 and the first and second inorganic buffer layers 172 and 174 are patterned through a photolithography process and an etching process, whereby the source and drain contact holes 124S and 124D, the pad contact hole 156, the first and second storage contact holes 178a and 178b, and the first auxiliary contact hole 168a are formed. The source and drain contact holes 124S and 124D and the pad contact hole 156 are formed to penetrate the interlayer insulation film 116. The first auxiliary contact hole 168a and the first storage contact hole 178a are formed to penetrate the interlayer insulation film 116 and the first and second inorganic buffer layers 172 and 174. The second storage contact hole 178b is formed to penetrate the interlayer insulation film 116 and the second inorganic buffer layer 174.

Figure 4G:
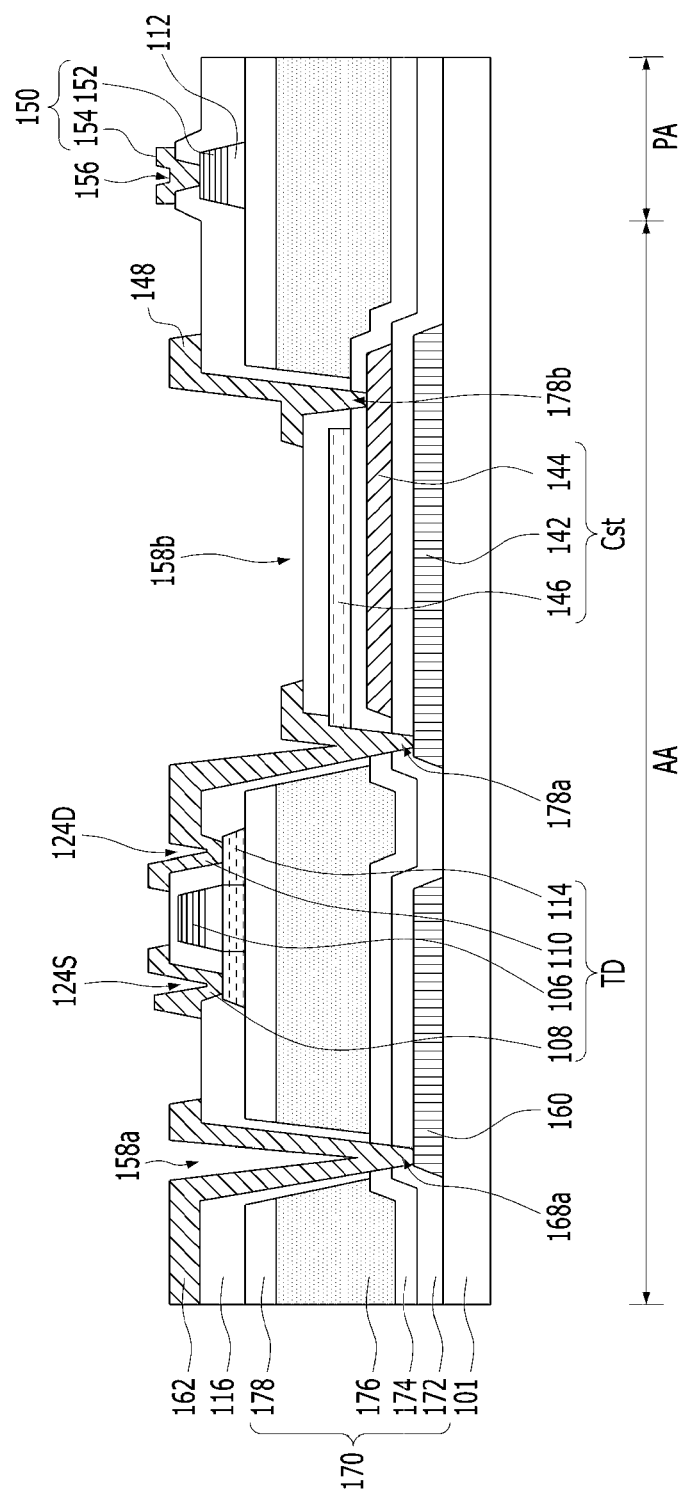

With reference to FIG. 4G, the data line DL, the source electrode 108, and the drain electrode 110 of the driving transistor TD, the drain electrode 148 of the switching transistor, the first auxiliary connection electrode 162, and the pad cover electrode 154 are formed on the interlayer insulation film 116, which has therein the source and drain contact holes 124S and 124D, the pad contact hole 156, the first and second storage contact holes 178a and 178b, and the first auxiliary contact hole 168a.

For example, a fourth conductive layer is formed on the interlayer insulation film 116, which has therein the source and drain contact holes 124S and 124D, the pad contact hole 156, the first and second storage contact holes 178a and 178b, and the first auxiliary contact hole 168a, through, for example, a sputtering deposition method. The fourth conductive layer may have a single-layer structure or a multi-layer structure, which is formed of a metal material such as, for example, Mo, Ti, Cu, AlNd, Al, Cr, or an alloy thereof. Subsequently, the fourth conductive layer is patterned through a photolithography process and an etching process, whereby the data line DL, the source electrode 108, and the drain electrode 110 of the driving transistor TD, the drain electrode 148 of the switching transistor, the first auxiliary connection electrode 162, and the pad cover electrode 154 are formed.

Figure 4H:
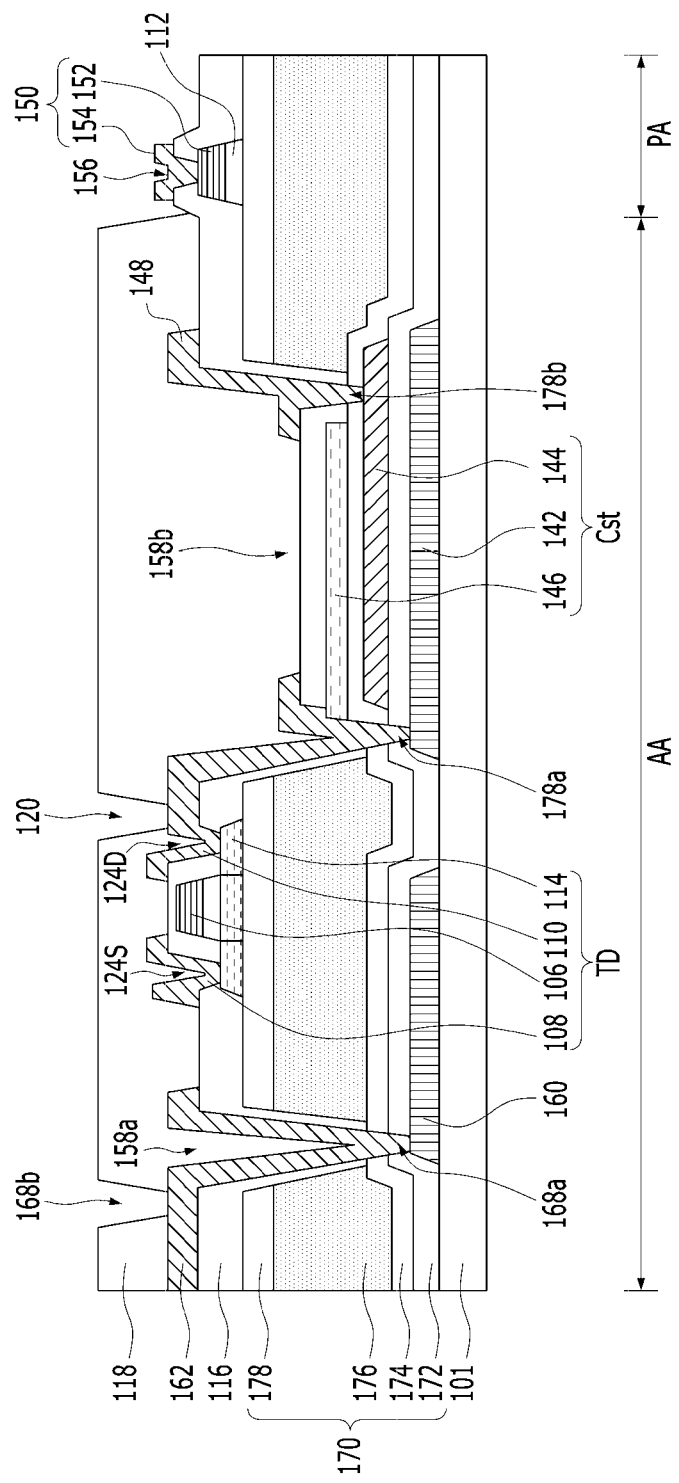

With reference to FIG. 4H, the planarization layer 118, which has therein the second auxiliary contact hole 168b and the pixel contact hole 120, is formed on the substrate 101, on which the source electrode 108 and the drain electrode 110 of the driving transistor TD, the drain electrode 148 of the switching transistor, the first auxiliary connection electrode 162, and the pad cover electrode 154 have been formed.

For example, the planarization layer 118 is formed on the substrate 101, on which the source electrode 108 and the drain electrode 110 of the drain electrode 148 of the driving transistor TD, the drain electrode 148 of the switching transistor, the first auxiliary connection electrode 162, and the pad cover electrode 154 have been formed, through a coating process. The planarization layer 118 is formed of an organic insulation material such as, for example, photo acryl. Subsequently, the planarization layer 118 is patterned through a photolithography process and an etching process, whereby the pixel contact hole 120 and the second auxiliary contact hole 168b are formed. The pixel contact hole 120 is formed to penetrate the planarization layer 118 to expose the drain electrode 110 of the driving transistor TD, and the second auxiliary contact hole 168b is formed to penetrate the planarization layer 118 to expose the first auxiliary connection electrode 162. Subsequently, the planarization layer 118, which is disposed on the pad cover electrode 154, is removed, whereby the pad cover electrode 154 is exposed outside.

Figure 4I:
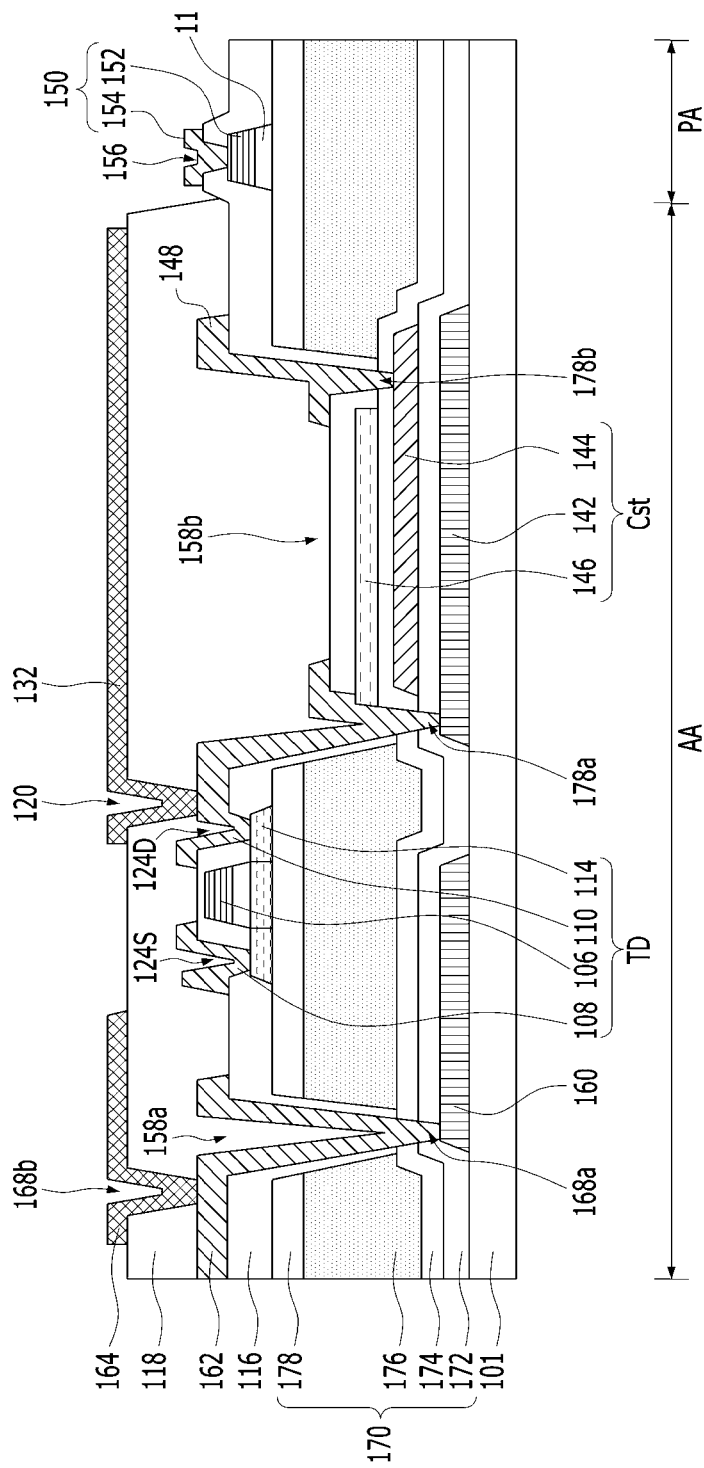

With reference to FIG. 4I, the anode 132 and the second auxiliary connection electrode 164 are formed on the substrate 101, on which the planarization layer 118, which has therein the pixel contact hole 120 and the second auxiliary contact hole 168b, has been formed.

For example, a photosensitive film is coated on the entire surface of the substrate 101, on which the planarization layer 118 has been formed, and is then patterned through a photolithography process, whereby a photosensitive protective film (not illustrated) is formed to cover the pad portion. Subsequently, a fifth conductive layer is coated on the entire surface of the substrate 101, on which the photosensitive protective film has been formed, and is then patterned through a photolithography process and an etching process, whereby the anode 132 and the second auxiliary connection electrode 164 are formed. Meanwhile, the photosensitive protective film is removed together with the photosensitive film, which was used for the patterning of the fifth conductive layer, through a stripping process.

Figure 4J:
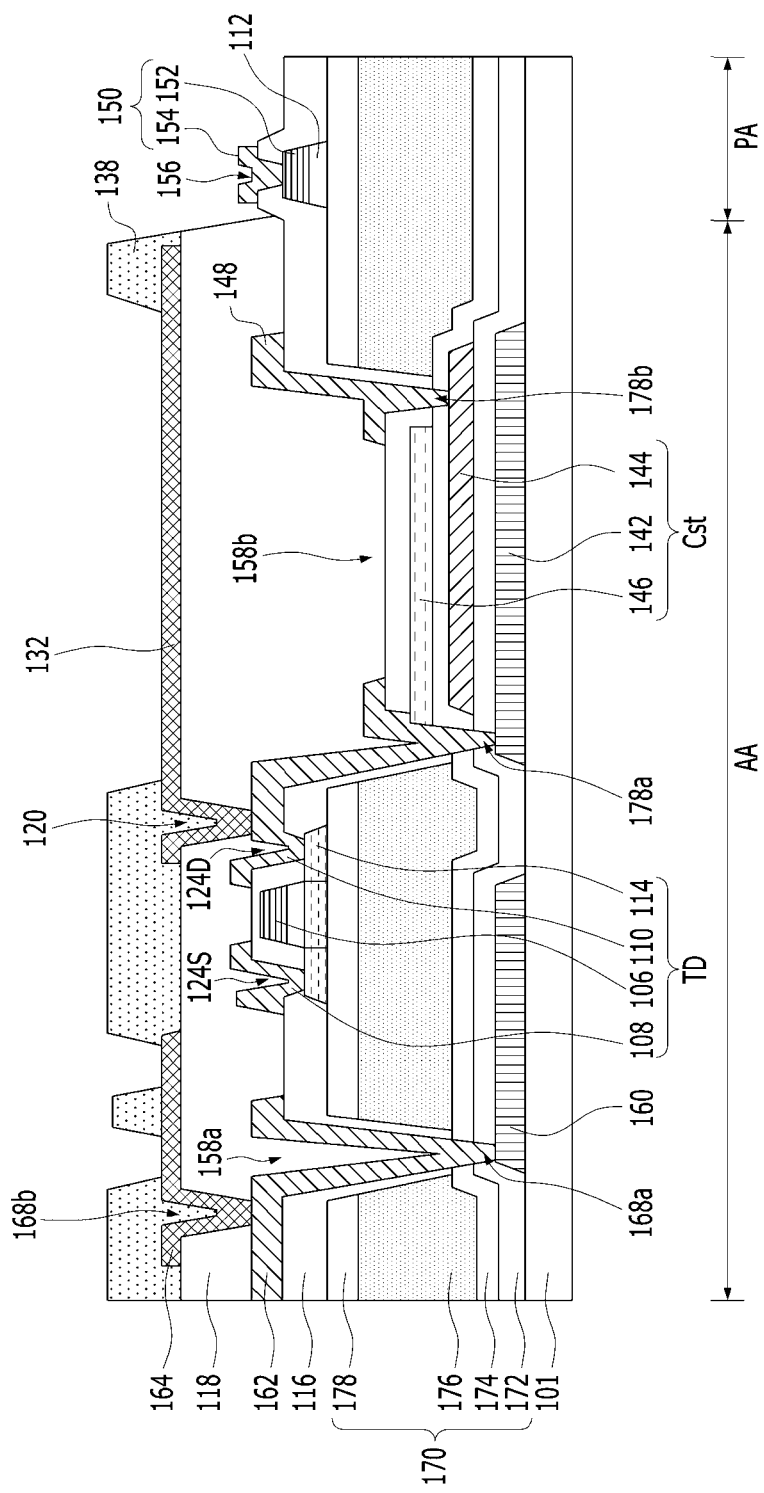

With reference to FIG. 4J, the bank 138 is formed on the substrate 101, on which the anode 132 and the second auxiliary connection electrode 164 have been formed.

For example a photosensitive film for the bank is coated on the entire surface of the substrate 101, on which the anode 132 and the second auxiliary connection electrode 164 have been formed, and is then patterned through a photolithography process, whereby the bank 138 is formed.

Figure 4K:
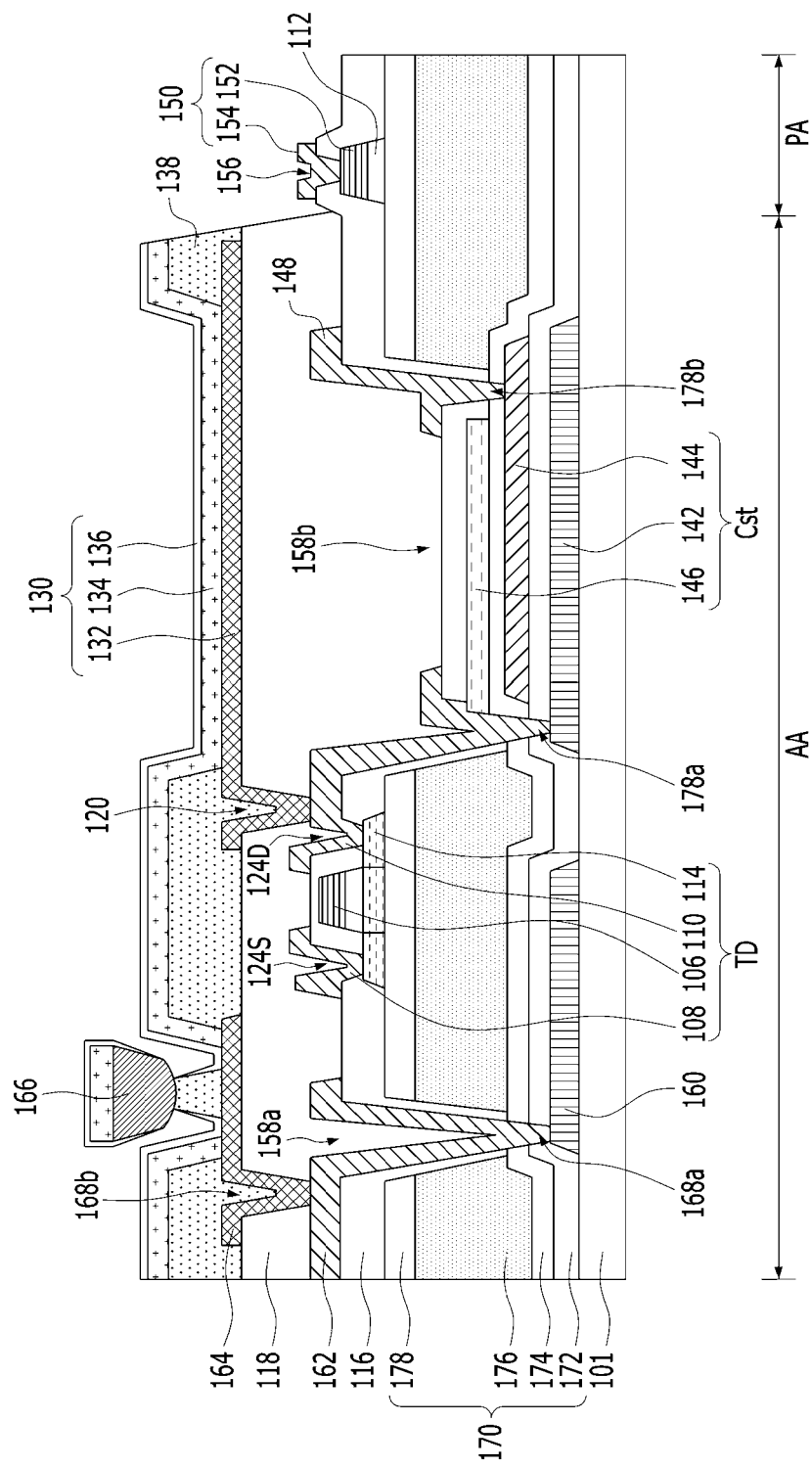

With reference to FIG. 4K, the partition 166, the light-emitting stack 134 and the cathode 136 are sequentially formed on the substrate 101, on which the bank 138 has been formed.

For example, a photosensitive film for the partition is coated on the substrate 101, on which the bank 138 has been formed, and is then patterned through a photolithography process, whereby an inversely-tapered-shaped partition 166 is formed. Subsequently, the cathode 136 using a sixth conductive layer and the light-emitting stack 134 are sequentially formed in the active area AA, excluding the pad area PA, through a deposition process using a shadow mask.

Figure 5:
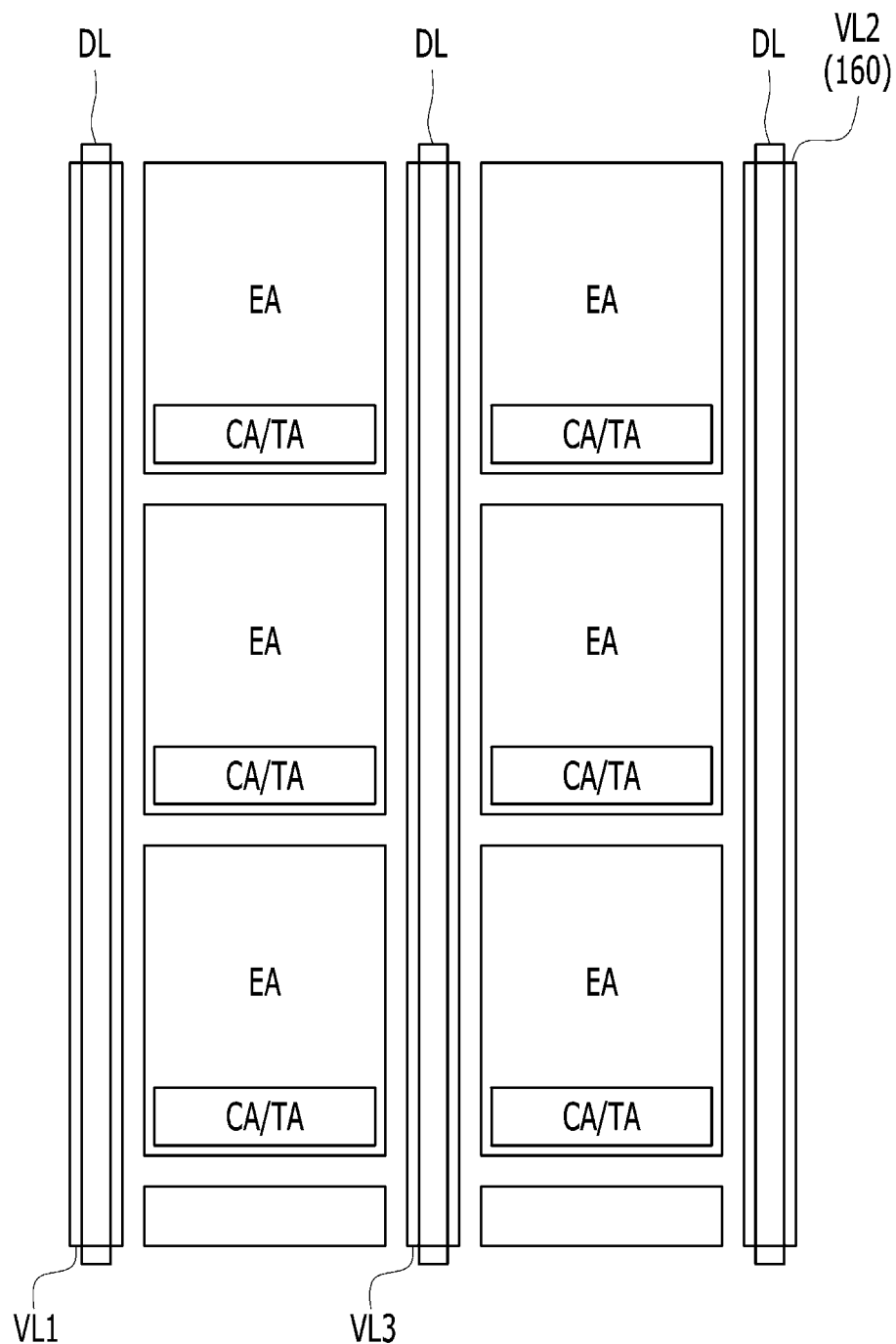
FIG. 5 is a plan view for explaining the arrangement of a transistor area, a capacitor area, and an emission area of the organic light-emitting display device according to an example embodiment of the present disclosure, which includes a reference line.

Although the pixel-driving circuit according to an example embodiment of the present disclosure has been described above as including the switching and driving transistors and the storage capacitor, this structure of the pixel-driving circuit is merely illustrative, and the present disclosure is not limited thereto. In an example embodiment, the present disclosure may be applied to a structure in which the pixel-driving circuit further includes a sensing transistor. The sensing transistor serves to sense the threshold voltage of the driving transistor TD, and the data voltage is compensated in proportion to the sensed threshold voltage. Herein, as shown in FIG. 5, because a reference line VL3, which is connected to a source electrode of the sensing transistor, overlaps the data line DL in the vertical direction, with at least one buffer layer 170, including the organic buffer layer 176, interposed therebetween, it may be possible to accomplish a high-resolution design.

Further, although the present disclosure has been described above with reference to a organic light-emitting display device, the present disclosure may also be applied to all kinds of display devices that include a storage capacitor and a transistor. In an example embodiment, a storage capacitor and a thin-film transistor of a liquid crystal display device may overlap each other in the vertical direction, with at least one buffer layer, including an organic buffer layer, interposed therebetween.

As is apparent from the above description, in a display device according to an example embodiment of the present disclosure, at least one of a switching transistor, a driving transistor and a data line and at least one of a storage capacitor, a low-voltage supply line, and a high-voltage supply line overlap each other in the vertical direction, with at least one buffer layer, including an organic buffer layer, interposed therebetween. Accordingly, a capacitor area, in which the storage capacitor is disposed, overlaps an emission area and a transistor area in the vertical direction, and signal lines overlap each other in the vertical direction, which may thereby ensure a sufficient process margin and consequently realize a high resolution and improve production yield.

It will be apparent to those skilled in the art that various modifications and variations can be made in the display device of the present disclosure without departing from the spirit or scope of the disclosure. Thus, it is intended that the present disclosure cover the modifications and variations of this disclosure provided they come within the scope of the appended claims and their equivalents.

What is claimed is:

1. A display device comprising:
   a substrate;
   a plurality of signal lines on the substrate;
   at least one transistor that overlaps one or more of the plurality of signal lines;
   multiple buffer layers disposed below an active layer of the transistor, wherein the multiple buffer layers include at least one organic buffer layer and a plurality of inorganic buffer layers; and
   a plurality of open holes that penetrate the at least one organic buffer layer below the active layer of the transistor,
   wherein one or more of the plurality of signal lines is between the substrate and the multiple buffer layers disposed below the active layer of the transistor, and
   wherein the at least one organic buffer layer is disposed among the plurality of inorganic buffer layers.

2. The display device according to claim 1, further comprising:
   a storage capacitor including at least three storage electrodes that overlap each other, with at least one of the plurality of inorganic buffer layers interposed therebetween.

3. The display device according to claim 2, wherein:
   the plurality of inorganic buffer layers include a first inorganic buffer layer, a second inorganic buffer layer, and a third inorganic buffer layer; and
   the first inorganic buffer layer, the second inorganic buffer layer, the at least one organic buffer layer, and the third inorganic buffer layer are sequentially arranged between the substrate and the active layer of the transistor.

4. The display device according to claim 3, wherein the third inorganic buffer layer is on the at least one organic buffer layer and has a same line width and a same shape as the organic buffer layer.

5. The display device according to claim 4, wherein the storage capacitor includes:
   a first storage electrode between the substrate and the first inorganic buffer layer;
   a second storage electrode on the first inorganic buffer layer; and
   a third storage electrode on the second inorganic buffer layer.

6. The display device according to claim 5, wherein:
   each of the first storage electrode, the second storage electrode, and the third storage electrode has a first side portion on a same side and an opposite side portion on another side which is opposite to the same side in a width direction;
   the first side portion of the second storage electrode protrudes in the width direction further than the first side portion of the third storage electrode; and
   the opposite side portion of each of the first storage electrode and the third storage electrode protrudes in the width direction further than the opposite side portion of the second storage electrode.

7. The display device according to claim 6, wherein the opposite side portion of the first storage electrode protrudes in the width direction further than the opposite side portion of the third storage electrode.

8. The display device according to claim 6, further comprising:
   a first storage contact hole that penetrates the first inorganic buffer layer and the second inorganic buffer layer to expose the first storage electrode and the third storage electrode; and
   a second storage contact hole that penetrates the second inorganic buffer layer to expose the second storage electrode.

9. The display device according to claim 8, wherein:
   the first storage electrode is on a same layer as the one of the plurality of signal lines that is between the substrate and the multiple buffer layers disposed below an active layer of the transistor;
   the first storage electrode and the one of the plurality of the signal lines are both formed of an opaque metal and are both between the substrate and the multiple buffer layers disposed below the active layer of the transistor; and
   the third storage electrode is formed of a same material as the active layer of the transistor.

10. The display device according to claim 8, further comprising:
    a light-emitting diode connected to the at least one transistor.

11. The display device according to claim 10, wherein the at least one transistor includes:
    a driving transistor connected to the light-emitting diode, the driving transistor including a drain electrode connected to the first storage electrode and the third storage electrode through the first storage contact hole; and
    a switching transistor connected to the driving transistor, the switching transistor including a drain electrode connected to the second storage electrode through the second storage contact hole.

12. The display device according to claim 11, wherein:
    the first storage electrode is on a same layer as one of the plurality of signal lines and formed of a same material as the one of the plurality of signal lines; and
    the third storage electrode is formed of a same material as the active layer of the driving transistor.

13. The display device according to claim 2, wherein the plurality of signal lines include:
    a low-voltage supply line connected to a light-emitting diode; and a high-voltage supply line and a data line both arranged parallel to the low-voltage supply line, wherein at least one of the low-voltage supply line, the high-voltage supply, line and the storage capacitor overlaps the data line, with the multiple buffer layers interposed therebetween.

14. The display device according to claim 11, wherein the plurality of signal lines include:

a low-voltage supply line connected to the light-emitting diode; and a high-voltage supply line arranged parallel to the low-voltage supply line, wherein at least one of the switching transistor and the driving transistor overlaps one of the low-voltage supply line, the high-voltage supply line and the storage capacitor, with the multiple buffer layers interposed therebetween.

15. The display device according to claim 13, further comprising:

a reference line on the substrate parallel to the data line; and a sensing transistor connected to the reference line, wherein the reference line overlaps the data line, with the multiple buffer layers interposed therebetween.

16. The display device according to claim 14, further comprising:

a reference line on the substrate; and a sensing transistor connected to the reference line, wherein the reference line overlaps at least one of the switching transistor and the driving transistor, with the multiple buffer layers interposed therebetween.

17. The display device according to claim 1, wherein a dielectric constant or a thickness of the organic buffer layer is configured to decrease signal interference between a component above the multiple buffer layers and a component below the multiple buffer layers.

18. The display device according to claim 1, wherein the display device is an organic light-emitting display device or a liquid crystal display device.

19. The display device according to claim 2, wherein the at least one organic buffer layer disposed below the active layer of the transistor overlaps the transistor, and does not overlap the storage capacitor.

20. The display device according to claim 10, wherein one of the plurality of open holes overlaps the light-emitting diode.

21. The display device according to claim 1, further comprising:

an interlayer insulation film that is in contact with lateral surfaces of the at least one organic buffer layer exposed through the plurality of open holes.

* * * * *